United States Patent [19]

Ujihara et al.

[11] Patent Number: 5,051,806
[45] Date of Patent: * Sep. 24, 1991

[54] GATE TURN-OFF THYRISTOR OF MULTI-EMITTER TYPE

[75] Inventors: Toshihide Ujihara, Hitachi; Shuroku Sakurada, Katsuta; Tadashi Sakaue; Shuji Musha, both of Hitachi, all of Japan

[73] Assignee: Hitachi, Ltd., Tokyo, Japan

[*] Notice: The portion of the term of this patent subsequent to Sep. 19, 2006 has been disclaimed.

[21] Appl. No.: 385,378

[22] Filed: Jul. 27, 1989

Related U.S. Application Data

[63] Continuation of Ser. No. 71,153, Jul. 8, 1987, Pat. No. 4,868,625.

[30] Foreign Application Priority Data

Jul. 8, 1986 [JP] Japan ................................ 61-158815

[51] Int. Cl.$^5$ ...................... H01L 29/74; H01L 29/00; H01L 29/72
[52] U.S. Cl. .......................................... 357/38; 357/20; 357/36; 357/37; 357/40; 357/68
[58] Field of Search ................... 357/38, 20, 36, 38 R, 357/38 G, 40, 37, 68

[56] References Cited

U.S. PATENT DOCUMENTS 4,868,625 9/1989 Ujihara et al. ........................ 357/38

Primary Examiner—Andrew J. James
Assistant Examiner—Ngan Van Ngo
Attorney, Agent, or Firm—Antonelli, Terry, Stout & Kraus

[57] ABSTRACT

A gate turn-off (GTO) thyristor has a plurality of unit GTO thyristors of strip-like configuration in a same semiconductor substrate, each unit GTO thyristor being constructed of an N emitter layer, P base layer, N base layer and P emitter layer. The P base and N base layers are shared in common for all the unit GTO thyristors which are formed in a multi-ring configuration. The exposed area of the P emitter layer of a unit GTO thyristor located far from the gate signal input area is made smaller than that of the P emitter layer of a unit GTO thyristor located relatively close to the gate signal input area.

6 Claims, 3 Drawing Sheets

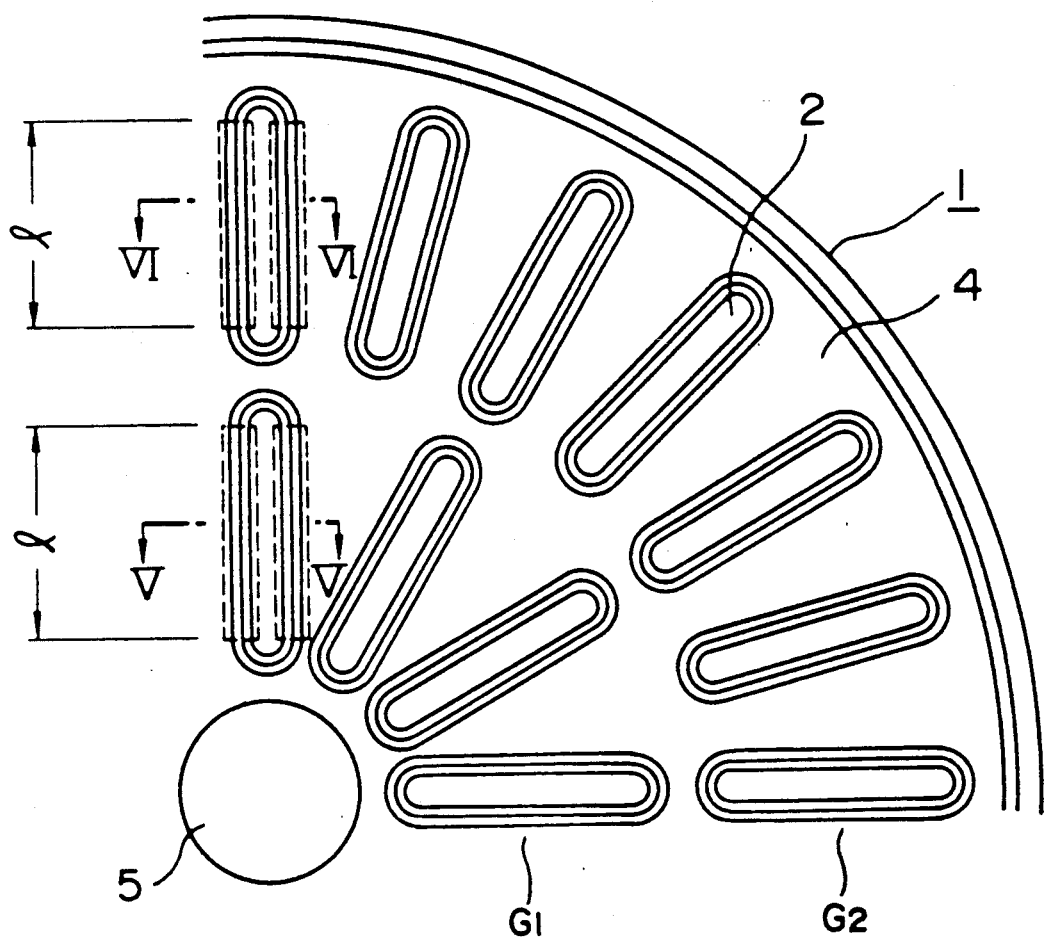
F I G. 4

GATE TURN-OFF THYRISTOR OF MULTI-EMITTER TYPE

This is a continuation of application Ser. No. 071,153, filed July 8, 1987, now U.S. Pat. No. 4,868,625.

BACKGROUND OF THE INVENTION

The present invention relates generally to a gate turn-off thyristor (hereinafter referred to as GTO thyristor). In particular, the invention relates to a multi-emitter type GTO thyristor suitable for control of a large current.

A GTO thyristor is a semiconductor switching control device which is constructed of a semiconductor substrate of pnpn 4-layer structure with intervening junctions, a pair of main electrodes ohmic-contacted to the outer layers of the substrate, and a gate electrode ohmic-contacted to one inner layer of the substrate, and whereby a current path between the main electrodes is switched, upon reception of a gate signal applied to the gate electrode, into a turn-on (turn-off) state from a turn-off (turn-on) state. A main technical theme of GTO thyristors is to turn off a large current at high speed with as small a gate current as possible. To solve this problem, various schemes have been proposed.

One known example is a so-called multi-emitter type GTO thyristor having the outer n layer (cathode-emitter layer) composed of a plurality of strip-like regions each having a width of 0.2 to 0.4 mm and a length of several milimeters, as shown in FIG. 1 of U.S. Pat. No. 4,500,903 and FIGS. 3 and 8 of U.S. Pat. No. 4,542,398. The gate electrode of a GTO thyristor of this type is formed surrounding each strip-like region with a constant space therefrom. With such an arrangement, it is possible during a turn-off operation to remove carriers from the inner p layer (p base layer) adjacent to each strip-like region, uniformly over the entirety of the cathode-emitter layer and at high speed.

Another example is a GTO thyristor having an anode-emitter layer of so-called shorted emitter structure wherein the inner n layer (n base layer) and the outer p layer (anode-emitter layer) are contacted to the anode electrode, as shown in U.S. Pat. No. 3,239,728. With such arrangement, removal of carriers during a turn-off operation can be effected not only from the gate electrode but also from the anode side, thereby improving the speed of a turn-off operation. As to the shorted structure of the anode-emitter layer, it is also known, as shown in U.S. Pat. No. 4,450,467 and U.S. Pat. No. 4,500,903, that n+ regions having a higher impurity concentration than that of the n base layer are formed between the n base layer and the anode electrode. These n+ regions help to remove carriers from the n base layer more rapidly.

As shown in FIGS. 1 and 2 of U.S. Pat. No. 4,500,903, a typical GTO thyristor employs both the cathode-emitter layer structure composed of a plurality of strip-like regions, and a shorted emitter structure of the anode-emitter layer, thereby realizing an improved turn-off performance. A problem associated with such a GTO thyristor is that if a large current capacity is required, a large number of strip-like regions constituting the cathode-emitter layer must be provided forming a multi-ring configuration as shown in U.S. Pat. No. 4,500,903 so that turn-off times may become non-uniform. This non-uniformity in the turn-off time will be discussed with reference to FIGS. 1 to 3.

In FIGS. 1 to 3, a semiconductor substrate 1 of disc shape comprises a cathode-emitter layer $N_E$ composed of a plurality of strip-like regions 13 adjacent to one main surface 11, a P base layer $P_B$ adjacent to the cathode-emitter layer $N_E$ and the main surface 11, an N base layer $N_B$ adjacent to the P base layer $P_B$, an anode-emitter layer $P_E$ adjacent to the N base layer $N_B$ and to another main surface 12, and an N+ layer of n-type impurity concentration higher than that of the N base layer $N_B$ adjacent to the N base layer $N_B$, anode-emitter layer and the main surface 12. Each strip-like region 13 is radially and concentrically arranged in the semiconductor substrate to form a double ring configuration as a whole. The anode-emitter layer $P_E$ is composed of a plurality of strip-like regions 14. The strip-like regions 14 are disposed such that when each strip-like region 13 of the cathode-emitter layer $N_E$ is orthogonally projected upon the main surface 12, the projected strip-like region 13 overlays upon two strip-like regions 14 with their longitudinal directions aligned with each other. The N+ layer of n-type high impurity concentration is thicker than the anode-emitter layer $P_E$ and occupies all the regions where the strip-like regions 14 are not present on the main surface 12. A cathode electrode 2 is ohmic-contacted to the strip-like region 13 on the main surface 11, whereas an anode electrode 3 is ohmic-contacted to the whole area of the main surface 12. A gate electrode 4 is ohmic-contacted to the exposed surface of the P base layer $P_B$ on the main surface 11 to surround the strip-like region 13 with a constant space therefrom. The plane of the gate electrode 4 formed on the main surface 11 is disposed nearer to the main surface 12 than the plane of the cathode electrode 2. A gate terminal 5 constitutes a gate signal input area.

The dimensions of unit GTO thyristors each having one strip-like region 13 as its outer layer are the same, irrespective of the inner and outer positions of the two rings. Particularly, irrespective of the inner (FIG. 2) and outer (FIG. 3) positions of the two rings, the length l, width w and distance d between two strip-like regions 14 are the same.

With the GTO thyristor constructed as above, the distances from the gate signal input area 5 to the strip-like regions 13 at the inner and outer positions of the two rings differ more than a length of the strip-like region 13. Thus, the transverse resistance of the gate electrode 4 for a unit GTO thyristor G2 at the outer ring is larger than that of a unit GTO thyristor G1 at the inner ring. Therefore, a reverse bias voltage (gate signal voltage) applied between the gate electrode 4 and the cathode electrode 2 of the unit GTO thyristor G2 at the outer ring is reduced by a amount greater than that applied to the unit GTO thyristor G1 at the inner ring, thereby lengthening the turn-off time of the unit thyristor at G2 during a turn-off operation.

Consequently, during a turn-off operation of a GTO thyristor, the unit GTO thyristors G1 at the inner position of the two rings turn off first wherein conduction current is then concentrated on the unit GTO thyristors G2 at the outer position which still remain on, thereby resulting in thermal breakdown of the unit GTO thyristors G2.

SUMMARY OF THE INVENTION

It is an object of the present invention to eliminate the above problems and provide a GTO thyristor having unit GTO thyristors of uniform turn-off time and capable of properly cutting off a large current.

A characteristic feature of the GTO thyristor of this invention achieving the above object resides in that the GTO thyristor comprises a plurality of unit GTO thyristors wherein the area of the anode-emitter layer of a unit GTO thyristor is made smaller as it is located further away from the gate signal input area. A unit GTO thyristor means a fine GTO thyristor comprising a multi-layer of a strip-like cathode-emitter layer, P base layer, N base layer and anode-emitter layer, and cathode, anode and gate electrodes. The anode-emitter layer having a shorted emitter structure.

Another feature of the GTO thyristor of this invention resides in that the GTO thyristor comprises a plurality of unit thyristors and the degree of shortening of the anode-emitter layer of the unit GTO thyristor is made greater as it is located further away from the gate signal input area. In other words, the contact area between the anode electrode and the N base layer of the unit GTO thyristor is made larger as it is located further away from the gate signal input area. It is preferable that the contact area of the N base layer to the anode electrode should be a high impurity concentration region.

BRIEF DESCRIPTION OF THE DRAWINGS

FIG. 4 is a schematic, sectional view showing an embodiment of the GTO thyristor according to the present invention;

DESCRIPTION OF THE PREFERRED EMBODIMENTS

Figure 1:
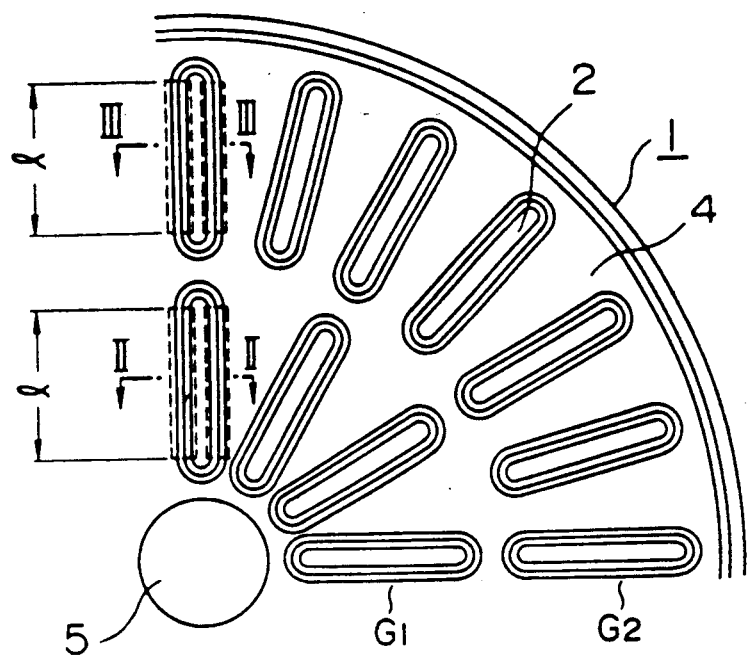
FIG. 1 is a schematic plan view showing a conventional GTO thyristor.
Figure 2:
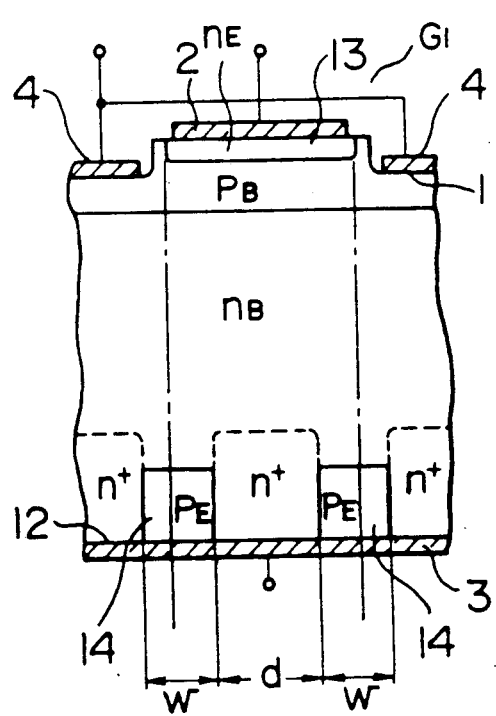
FIG. 2 is a schematic, sectional view along line II—II of FIG. 1.
Figure 3:
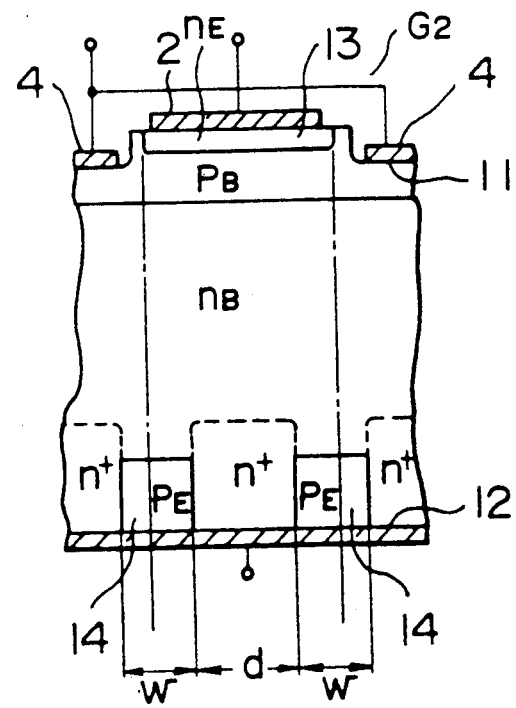
FIG. 3 is a schematic, sectional view along line III—III of FIG. 1.
Figure 5:
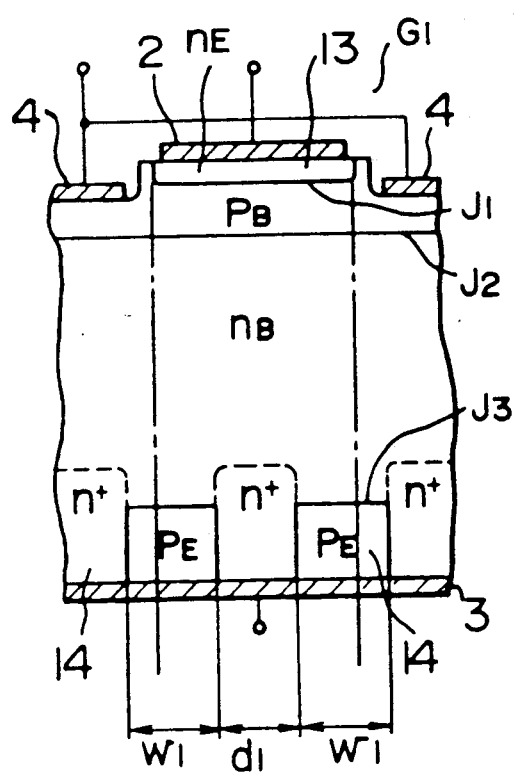
FIG. 5 is a schematic, sectional view along line V—V of FIG. 4.
Figure 6:
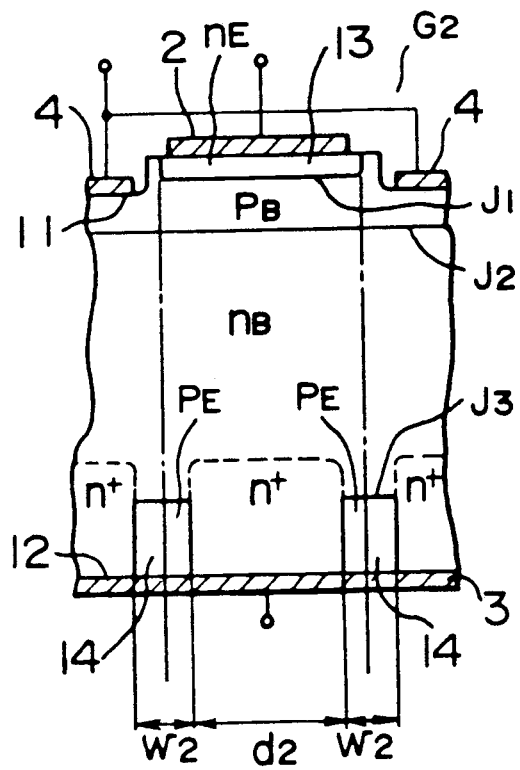
FIG. 6 is a schematic, sectional view along line VI—VI of FIG. 4.

Referring now to FIGS. 4 to 6, a semiconductor substrate 1 of disc shape comprises: a cathode-emitter layer $N_E$ having a plurality of strip-like regions 13 adjacent to a main surface 11; a P base layer $P_B$ adjacent to the cathode-emitter layer $N_E$ and the main surface 11 the layer $P_B$ forming a first PN junction $J_1$ with the cathode-emitter layer $N_E$ and having an impurity concentration lower than that of the cathode-emitter layer $N_E$; an N base layer $N_B$ adjacent to the P base layer $P_B$, the layer $N_B$ forming a second PN junction $J_2$ with the P base layer $P_B$ and having an impurity concentration lower than that of the P base layer $P_B$; an anode-emitter layer $P_E$ having a plurality of strip-like regions 14 adjacent to the N base layer $N_B$ and another main surface 12, the layer $P_E$ forming a third PN junction $J_3$ with the N base layer $N_B$ and having an impurity concentration lower than that of the N base layer $N_E$; and an n+ layer adjacent to the N base layer $N_B$, anode-emitter layer $P_E$ and main surface 12, the n+ layer having an impurity concentration higher than that of the N base layer $N_B$ Each strip-like region 13 is radially and concentrically arranged in the semiconductor substrate to form a double ring configuration as a whole. The strip-like regions 14 are disposed such that when each strip-like region 13 is orthogonally projected upon the main surface 12, the projected strip-like region 13 overlaps upon two strip-like regions 14 with their longitudinal directions aligned with each other.

The N+ layer of n-type high impurity concentration is thicker than the anode-emitter layer $P_E$ and occupies all the regions where the strip-like regions 14 are not present on the main surface 12. The dimensions of unit GTO thyristors each having one strip-like region 13 as its outer layer are different depending upon the inner and outer positions of the two rings. Particularly, the dimensions are defined by the following two formulas, using $w_1$ as the width of the strip-like region 14 and $d_1$ as the distance between strip-like regions 14, respectively of a unit GTO thyristor $G_1$ at the inner position of the two rings, and using $w_2$ as the width of the strip-like region 14 and $d_2$ as the distance between strip-like regions 14, respectively of a unit GTO thyristor $G_2$ at the outer position:

$$w_1 > w_2 \tag{1}$$

$$d_1 < d_2 \tag{2}$$

$$2w_1 + d_1 = 2w_2 + d_2 \tag{3}$$

In other words, the exposed area of the anode-emitter layer $P_E$ at the main surface 12 of the unit GTO thyristor $G_2$ at the inner position is made smaller than that of the unit GTO thyristor $G_1$ at the outer position, and the 20 exposed area of the N+ layer of n-type high impurity concentration is made correspondingly larger.

A cathode electrode 2 is ohmic-contacted to each strip-like region 13 on the main surface 11, an anode electrode 3 is ohmic-contacted to the whole main surface 12, and a gate electrode 4 is ohmic-contacted to the exposed P base layer $P_B$ on the main surface 11 surrounding the strip-like region 13 with a constant space therefrom. The plane of the gate electrode 4 on the main surface 11 is disposed nearer to the main surface 12 than that of the cathode electrode 2. A gate terminal 5 electrically connected to the gate electrode substantially at the center of the main surface 11 serves as a gate signal input area.

In the GTO thyristor constructed as above, the following relations are satisfied between the unit GTO thyristors at the far position from the gate signal input area 5 and at the near position thereto:

(a) the amount of holes stored near at the second junction $J_2$ at an ordinary on-state is small as seen from the inequality (1).

(b) the ability of removing residual carriers in the N base layer $N_B$ during a turn-off operation is great as seen from the inequality (2).

Consequently, a turn-off delay of the unit GTO thyristor $G_2$ at the outer ring relative to the unit GTO thyristor $G_1$ at the inner ring can be eliminated by selecting suitable $w_1$, $d_1$, $w_2$ and $d_2$ which satisfy the inequalities (1) and (2) and conform to the respective distances from the gate terminal 5. Thus, all the unit GTO thyristors on the semiconductor substrate can be turned off substantially at a same time.

The present invention has been applied to a GTO thyristor which is constructed of a plurality of unit GTO thyristors disposed forming a double-ring configuration and a gate signal input area provided at the center of the semiconductor substrate. The invention is not limited thereto, but various modifications are possible. For example, unit GTO thyristors may be disposed forming a three or more ring configuration with a gate signal input area being provided at the center, at the periphery, at both the center and the periphery, or at the intermediate, respectively of the semiconductor substrate. Such arrangement can also obtain the same effects as those of the GTO thyristor shown in FIGS. 4 to 6 on condition that the inequalities (1) and (2) are adopted to each unit GTO thyristor. Further, it can be readily understood that the invention can be applied to a GTO thyristor of the type that although a plurality of unit GTO thyristors are not disposed in a ring configuration, they are controlled using a single gate signal input area.

As seen from the foregoing description, the unit GTO thyristors of a GTO thyristor on a single pellet can be turned off at a same time during a turn-off operation, thus realizing a GTO thyristor capable of cutting off a large current effectively.

We claim:

1. A gate turn-off thyristor comprising:
a semiconductor substrate of disc shape having a pair of main surfaces on opposite sides thereof, said semiconductor substrate comprising, between said pair of main surfaces, a first emitter layer of a first conductivity type adjacent to one of said main surfaces, a first base layer of a second conductivity type adjacent to said one main surface and said first emitter layer, a second base layer of the first conductivity type adjacent to said first base layer and the other of said main surfaces and a second emitter layer of the second conductivity type adjacent to said second base layer and said other main surface, said first emitter layer including a plurality of strip-like regions disposed in a multi-ring configuration wherein each said strip-like region has a length disposed in a direction aligned with the radial direction of said disc-shaped semiconductor substrate and said regions being respectively separated by said first base layer, said second emitter layer including a plurality of spaced-apart strip-like regions which extend to said other main surface so as to expose an associated area for contact and wherein said strip-like regions within each pair of strip-like regions of said second emitter layer are separated from one another by a respective portion of said second base layer, and said strip-like regions of said first and second emitter layers are disposed such that when both said first and second emitter layers are orthogonally projected on said other main surface respective strip-like regions of both said first and second emitter layers become length-wise aligned along said radial direction and overlap each other;
a first main electrode ohmic-contacted to said first emitter layer on said one main surface of said semiconductor substrate;
a second main electrode ohmic-contacted to said second emitter layer and said second base layer on said other main surface of said semiconductor substrate;
a gate electrode ohmic-contacted to said first base layer on said one main surface of said semiconductor substrate and surrounding each of said strip-like regions of said first emitter layer and separated therefrom with a constant space;
a gate terminal disposed on a predetermined area of said disc-shaped semiconductor substrate and at a desired location on said gate electrode electrically connected to said gate electrode;
wherein said strip-like regions are disposed on said disc-shaped substrate such that, when both said first and second emitter layers are orthogonally projected on said other main surface, a single strip-like region of said first emitter layer overlaps a respective pair of strip-like regions of said second emitter layer; and
wherein the strip-like regions of said second emitter layer associated with each pair of strip-like regions have a distance therebetween which is greater for those strip-like region pairs located further away from said gate terminal than for those closer to said gate terminal.

2. A gate turn-off thyristor according to claim 1, wherein the distance corresponding to the separation of each pair of strip-like regions of said second emitter layer corresponds to the width of a respective second base layer portion therebetween.

3. A gate turn-off thyristor according to claim 2, wherein an arrangement of a single strip-like region of said first emitter layer, said first base layer, said second base layer and a pair of strip-like regions of said second emitter layer which are separated by a respective second base layer portion comprises a unit GTO.

4. A gate turn-off thyristor according to claim 3, wherein said disc-shaped semiconductor substrate comprises a coaxial arrangement of a plurality of rings, each ring corresponding to a plurality of unit GTOs.

5. A gate turn-off thyristor according to claim 4, wherein said first and second emitter layers comprise a cathode and an anode, respectively.

6. A gate turn-off thyristor according to claim 5, wherein said first and second conductivity type layers comprise N and P-type conductivity layers, respectively.

* * * * *